(12) United States Patent
Nozoe et al.

(10) Patent No.: US 11,626,857 B2
(45) Date of Patent: Apr. 11, 2023

(54) ACOUSTIC WAVE ELEMENT

(71) Applicant: KYOCERA Corporation, Kyoto (JP)

(72) Inventors: Soichiro Nozoe, Kyoto (JP); Tetsuya Kishino, Nara (JP)

(73) Assignee: KYOCERA Corporation, Kyoto (JP)

( * ) Notice: Subject to any disclaimer, the term of this patent is extended or adjusted under 35 U.S.C. 154(b) by 575 days.

(21) Appl. No.: 16/631,744

(22) PCT Filed: Jul. 23, 2018

(86) PCT No.: PCT/JP2018/027503
§ 371 (c)(1),
(2) Date: Jan. 16, 2020

(87) PCT Pub. No.: WO2019/022006
PCT Pub. Date: Jan. 31, 2019

(65) Prior Publication Data
US 2020/0169242 A1 May 28, 2020

(30) Foreign Application Priority Data
Jul. 27, 2017 (JP) .............................. JP2017-145730

(51) Int. Cl.
*H03H 9/02* (2006.01)
*H03H 9/145* (2006.01)
*H03H 9/25* (2006.01)

(52) U.S. Cl.
CPC .... *H03H 9/02818* (2013.01); *H03H 9/02559* (2013.01); *H03H 9/02866* (2013.01); *H03H 9/14544* (2013.01); *H03H 9/25* (2013.01)

(58) Field of Classification Search
CPC ........... H03H 9/02818; H03H 9/02559; H03H 9/02866; H03H 9/14544; H03H 9/25
(Continued)

(56) References Cited

U.S. PATENT DOCUMENTS

2019/0007022 A1* 1/2019 Goto .................. H03H 9/02559

FOREIGN PATENT DOCUMENTS

| CN | 110463038 A | 11/2019 |
| JP | 2006-319679 A | 11/2006 |
| JP | 6375471 B1 | 8/2018 |

OTHER PUBLICATIONS

Clairet et al. "New generation of composite substrates based on a layer of LiTaO3 on silicon for surface acoustic waves component", HAL Id: hal-03231876 https://hal.archives-ouvertes.fr/hal-03231876 Submitted on May 21, 2021 (Year: 2021).*

* cited by examiner

*Primary Examiner* — Hafizur Rahman
(74) *Attorney, Agent, or Firm* — Procopio Cory Hargreaves and Savitch LLP

(57) ABSTRACT

An acoustic wave element includes an IDT electrode including a plurality of electrode fingers and exciting a surface acoustic wave, a first substrate including an upper surface on which the IDT electrode is located, the first substrate being configured by a piezoelectric crystal, and a second substrate bonded to a side where a lower surface of the first substrate is located. Either of a first region which continues from the lower surface of the first substrate toward a side where the upper surface is located or a second region which continues from the lower surface of the first substrate toward a side where the second substrate is located is a low resistance region having a resistance value of $5 \times 10^3 \Omega$ to $5 \times 10^7 \Omega$.

8 Claims, 10 Drawing Sheets

(58) Field of Classification Search
USPC .................................................. 310/313 B
See application file for complete search history.

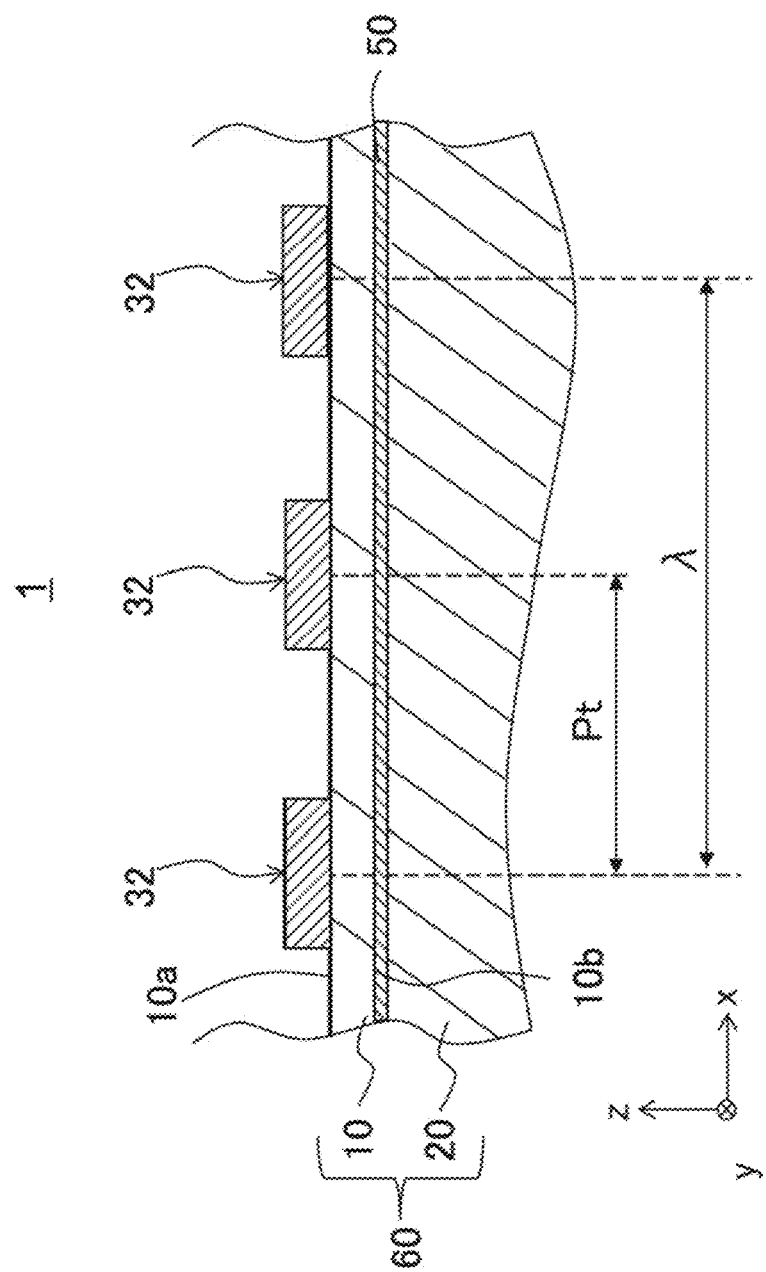

FIG. 5

| RESISTANCE VALUE (Ω) | | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|
| 1.50E+10 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+09 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+09 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+08 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+08 | 99.9 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+07 | 99.6 | 99.8 | 99.9 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+07 | 98.8 | 99.5 | 99.8 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+06 | 96.3 | 98.4 | 99.2 | 99.6 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+06 | 88 | 95.2 | 98.6 | 99.2 | 99.8 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+05 | 84.9 | 87.4 | 93 | 96.9 | 98.9 | 99.9 | 99.8 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+05 | 70 | 77.1 | 87.3 | 94.2 | 97.8 | 100 | 99.7 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+04 | 76.2 | 85.2 | 92.1 | 96.3 | 98.5 | 100 | 99.8 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+04 | 88.2 | 94.5 | 97.1 | 98.6 | 99.5 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+03 | 91.9 | 96.4 | 98.3 | 99.1 | 99.8 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+03 | 97.3 | 98.8 | 99.4 | 99.7 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 5.00E+02 | 99.2 | 99.6 | 99.8 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| 1.50E+02 | 99.7 | 99.9 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
|  | 0.5 | 1 | 2 | 3 | 4 | 5 | 6 | 7 | 8 | 9 | 10 | 11 | 12 | 13 | 14 | 15 | 16 | 17 | 18 | 19 | 20 | 25 | 30 | 35 | | | | | | | | | | | |

THICKNESS OF FIRST SUBSTRATE (μm)

ACOUSTIC WAVE ELEMENT

TECHNICAL FIELD

The present disclosure relates to an acoustic wave element.

BACKGROUND ART

Conventionally, it has been known to prepare an acoustic wave element by providing an electrode on a composite substrate formed by bonding a support substrate and a piezoelectric substrate to each other for the purpose of improving electrical characteristics. Here, the acoustic wave element is for example used as a bandpass filter in a mobile phone or another communication apparatus. Further, as the composite substrate, there is known one using lithium niobate or lithium tantalate as the piezoelectric substrate and using silicon, quartz, a ceramic, or the like as the support substrate (see Japanese Patent Publication No. 2006-319679).

SUMMARY OF INVENTION

Technical Problem

However, in recent years, the portable terminal devices used in mobile communications have been made increasingly smaller in size and lighter in weight. In addition, in order to realize a higher quality of communication, an acoustic wave element provided with further higher electrical characteristics has been demanded. For example, in order to reduce leakage of input/output signals to an adjacent channel, an acoustic wave element excellent in attenuation characteristic in a specified frequency band out of the passing band has been demanded.

The present disclosure was made in consideration of such a problem and an object thereof is to provide an acoustic wave element excellent in electrical characteristics.

Solution to Problem

An acoustic wave element of the present disclosure includes an IDT electrode, a first substrate, and a second substrate. The IDT electrode includes a plurality of electrode fingers and excites a surface acoustic wave. The first substrate includes an upper surface on which the IDT electrode is located and is configured by a piezoelectric crystal. The second substrate is bonded to a side where a lower surface of the first substrate is located. Further, either of a first region which continues from the lower surface of the first substrate toward a side where the upper surface is located or a second region which continues from the lower surface of the first substrate toward a side where the second substrate is located is a low resistance region having a sheet resistance of $5 \times 10^3 \Omega$ to $5 \times 10^7 \Omega$.

Advantageous Effect of Invention

According to the above configuration, an acoustic wave element excellent in electrical characteristics can be provided.

BRIEF DESCRIPTION OF DRAWINGS

FIG. 2 is an enlarged cross-sectional view of a principal part taken along the II-II line in FIG. 1.

Each of FIG. 3A, FIG. 3B

FIG. 5 is a graph showing the relationships between the sheet resistance value of the low resistance region and the phase ratio between a resonance frequency and an antiresonance frequency.

DESCRIPTION OF EMBODIMENTS

Figure 1:
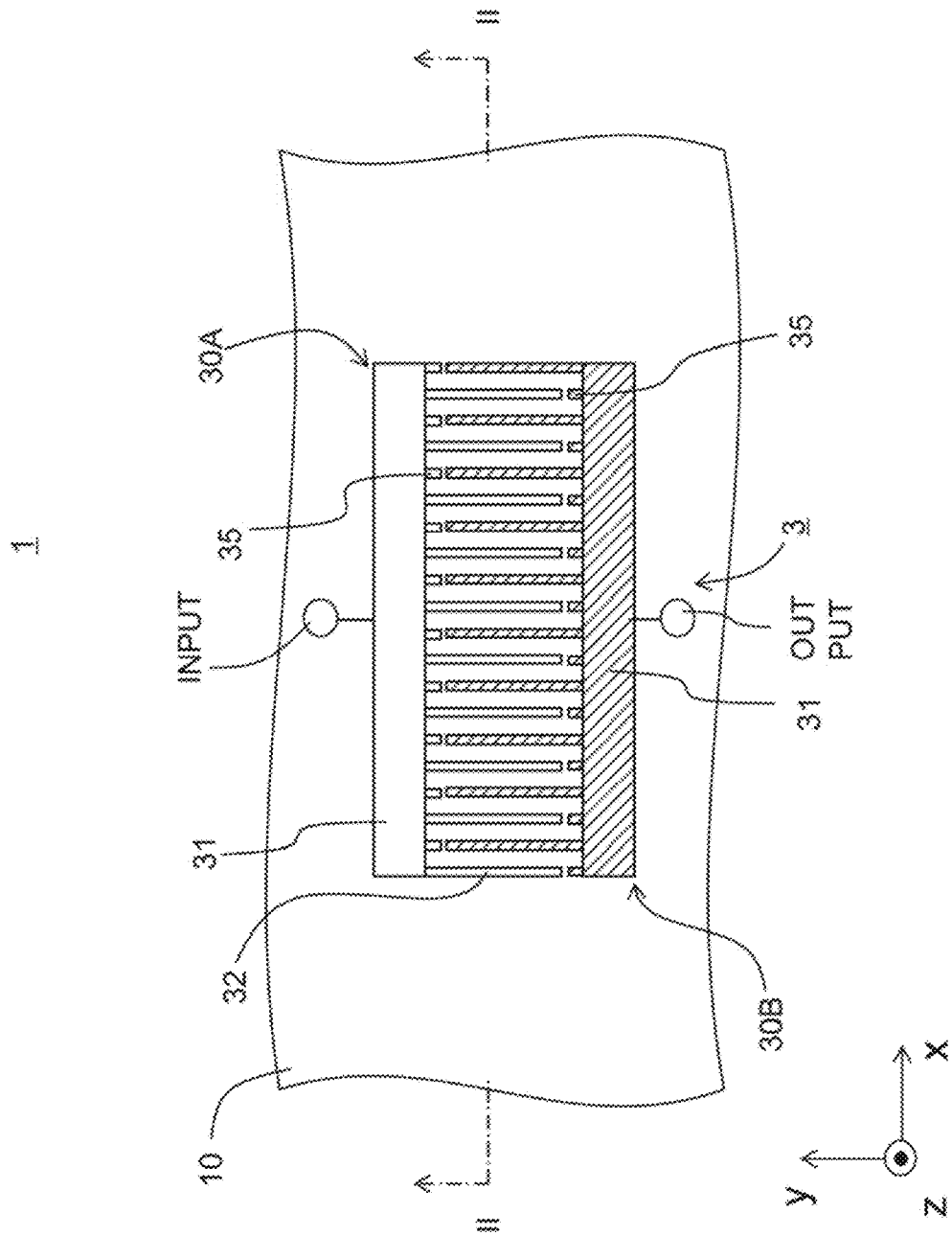
FIG. 1 is a top surface view of an acoustic wave element according to the present disclosure.

Below, one example of an acoustic wave element of the present disclosure will be explained in detail by using the drawings. Note that, the drawings used in the following explanation are schematic ones. Size ratios etc. in the drawings do not always coincide with the actual ones.

In the acoustic wave element, any direction may be defined as "above" or "below". In the following explanation, however, for convenience, an orthogonal coordinate system xyz will be defined, the positive side of the z-direction will be deemed the upper part, and the "upper surface" or "lower surface" and other terms will be used accordingly.

Further, the present disclosure discloses an example using a surface acoustic wave (SAW) as the acoustic wave. Below, sometimes the acoustic wave element will be referred to as a SAW element.

(Outline of Configuration of SAW Element)

FIG. 1 is a plan view showing the configuration of a SAW element 1 according to one embodiment of the present invention. FIG. 2 is an enlarged cross-sectional view of a principal part taken along the II-II line in FIG. 1.

In the SAW element 1, an IDT (interdigital transducer) electrode 3 is provided on a composite substrate 60. The composite substrate 60 is configured by a first substrate 10 and a second substrate 20 bonded to each other. The IDT electrode 3 is positioned on an upper surface 10a of the first substrate 10. Further, the SAW element 1, other than this, may have a protective layer covering the upper surface 10a, wirings for input/output of signals to/from the IDT electrode 3, and the like as well.

The IDT electrode 3 is configured by a pair of comb-shaped electrodes 30 formed by a first comb-shaped electrode 30A and a second comb-shaped electrode 30B. In FIG. 1, in order to clearly differentiate the first comb-shaped electrode 30A and the second comb-shaped electrode 30B, the second comb-shaped electrode 30B is hatched. Note that, in the following explanation, sometimes the first comb-shaped electrode 30A and the second comb-shaped electrode 30B will be simply referred to as the "comb-shaped electrodes 30" and will not be differentiated. Further, for the configurations etc. relating to the first comb-shaped electrode 30A, sometimes "first" and "A" will be attached like the "first bus bar 31A" etc. For the configurations etc. relating to the second comb-shaped electrode 30B, sometimes "second" and "B" will be attached like the "second bus bar 31B" etc. Further, sometimes these "first", "second", "A", and "B" will be omitted.

The comb-shaped electrodes 30, as shown in FIG. 1, have two bus bars 31 which face each other, pluralities of electrode fingers 32 which extend from the bus bars 31 to the other bus bar 31 sides, and pluralities of dummy electrode fingers 35 which extend from the bus bars 31 to the other bus bar 31 sides between two or more electrode fingers 32. Further, the pair of comb-shaped electrodes 30 are arranged so that their pluralities of electrode fingers 32 intersect (intermesh) with each other. Note that, dummy electrodes finger 35 need not be arranged.

The SAW is propagated in a direction perpendicular to the pluralities of electrode fingers 32. Accordingly, after considering the crystal orientation of the first substrate 10 configured by a later explained piezoelectric crystal, the two bus bars 31 are arranged so as to face each other in a direction crossing the direction in which the SAW is desired be propagated, and the pluralities of electrode fingers 32 are formed so as to extend in a direction perpendicular with respect to the direction in which the SAW is desired to be propagated.

Note that, the direction of propagation of the SAW is set according to the orientation etc. of the pluralities of electrode fingers 32. In the present embodiment, however, for convenience, sometimes the orientation etc. of the pluralities of electrode fingers 32 will be explained using the direction of propagation of the SAW as the standard.

Further, the orthogonal coordinate system xyz is defined so that the x-axis is perpendicular to the electrode fingers 32 (parallel to the direction of propagation of SAW), the y-axis is parallel to the electrode fingers 32, and the z-axis is perpendicular to the upper surface 10a of the first substrate 10. That is, the orthogonal coordinate system xyz is defined using not the outer shape of the first substrate 10, but the IDT electrode 3 (direction of propagation of SAW) as the standard.

The bus bars 31 are for example substantially formed in long shapes so as to linearly extend with constant widths. Accordingly, the edge parts in the bus bars 31 on the sides where they face each other are linear shaped. Note that, the bus bars 31 may be formed integrally with the wirings as well.

The pluralities of electrode fingers 32 are substantially formed in long shapes so as to linearly extend with constant widths and are arranged in the direction of propagation of the SAW at substantially constant intervals. The pluralities of electrode fingers 32 in the pair of comb-shaped electrodes 30 are provided so that, as shown in FIG. 2, a pitch Pt of repeated intervals between the centers of neighboring electrode fingers 32 for example becomes equal to the half wavelength of the wavelength λ of the SAW at a frequency at which resonance is desired to be caused. Note that, as the repeated intervals of the pitch Pt, use may be made of the intervals of the neighboring electrode fingers 32 from end to end on the same side. Further, as the pitch Pt of the plurality of electrode fingers 32, use can be made of a mean value of the intervals between the centers of each two neighboring electrode fingers 32.

A gap length G of the interval between an electrode finger 32 and a dummy electrode finger 35 (length in the y-direction of the gap) is for example the same among the plurality of gap lengths G. The gap length G is for example 0.10 μm to 1.00 μm. Further, when the wavelength of the SAW is λ, the gap length G is for example 0.1λ to 0.6λ.

The IDT electrode 3 is for example formed by a metal material. As this metal material, for example there can be mentioned Al or an alloy containing Al as the principal ingredient (Al alloy). The Al alloy is for example an Al—Cu alloy. Note that, the IDT electrode 3 may be configured by a plurality of metal layers as well. The various dimensions of the IDT electrode 3 are suitably set in accordance with the electrical characteristics etc. demanded from the acoustic wave element 1. As one example, the thickness (z-direction) of the IDT electrode 3 is for example 50 nm to 400 nm.

The IDT electrode 3 may be directly arranged on the upper surface 10a of the first substrate 10 or may be arranged on the upper surface 10a of the first substrate 10 through another member. As another member, for example, use can be made of Ti, Cr, or an alloy of the same or the like. When the IDT electrode 3 is arranged on the upper surface 10a of the first substrate 10 through another member, the thickness of the other member is set to an extent where almost no influence is exerted upon the electrical characteristics of the IDT electrode 3 (for example a thickness of 5% of the thickness of the IDT electrode 3 in the case of Ti).

When voltage is applied to the first substrate 10 by the IDT electrode 3, an acoustic wave propagating in the x-direction along the upper surface 10a is excited near the upper surface 10a of the first substrate 10. Further, the SAW is reflected at a boundary between the electrode fingers 32 and a region where the electrode fingers 32 are not arranged (long-shaped region between neighboring electrode fingers 32). Further, a standing wave having the pitch Pt of the electrode fingers 32 as a half wavelength is formed. The standing wave is converted to an electrical signal having the same frequency as that of this standing wave and is extracted by the electrode fingers 32. In this way, the SAW element 1 functions as a resonator or filter.

(Composite Substrate 60)

The composite substrate 60, as shown in FIG. 2, is a so-called bonded substrate and is comprised of the first substrate 10 and the second substrate 20 bonded together. Further, the low resistance region 50 is positioned at the intermediate position in the thickness of the composite substrate 60.

Figure 3A:
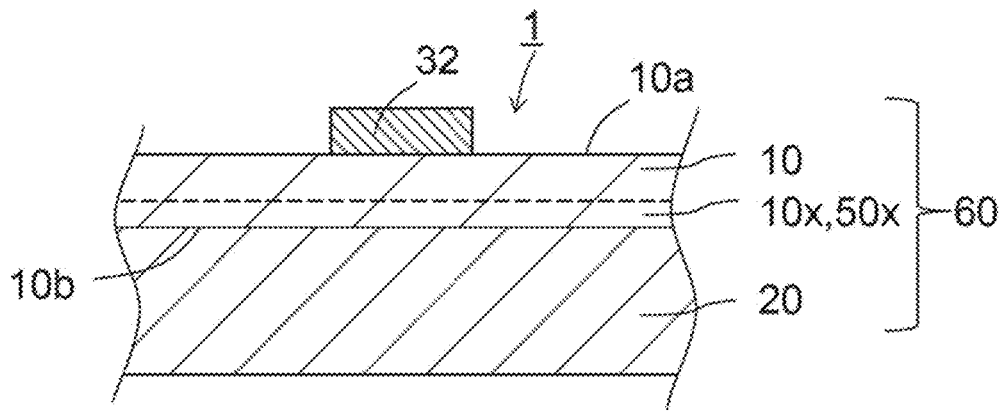
FIG. 3C is an enlarged cross-sectional view of a principal part showing a modification of a composite substrate 60.

The low resistance region 50 may be a first region 50x which continues from a lower surface 10b of the first substrate 10 toward the upper surface 10a side or may be a second region 50y which continues from the lower surface 10b of the first substrate 10 toward the side opposite to the upper surface 10a. The first region 50x is a part of the first substrate 10 and is a region 10x which continues from the lower surface 10b of the first substrate 10 (FIG. 3A). The second region 50y may be for example an intermediate layer 40 which is interposed between the first substrate 10 and the second substrate 20 (FIG. 3B) or may be a region 20x which is a part of the second substrate 20 and continues from the lower surface of the first substrate 10 (FIG. 3C).

In this example, the explanation will be given by taking as an example the composite substrate 60 having the configuration shown in FIG. 3B.

The first substrate 10 is formed by a piezoelectric material and is for example configured by a substrate of a single crystal having a piezoelectric characteristic such as a lithium tantalate (LiTaO$_3$: hereinafter, referred to as an LT) crystal or lithium niobate crystal. Specifically, for example, a Y-rotated and X-propagated LT substrate may be used for the first substrate 10. More specifically, it is configured by a 36° to 50° Y-cut, and X-propagated LT substrate.

The first substrate 10 has a relatively thin constant thickness. The thickness will be explained later.

The second substrate 20 is one supporting the relatively thin first substrate 10. The material thereof is not particularly limited so far as it is a material provided with strength and flatness. For example, a substrate configured by an insulating material such as a sapphire substrate or an SiC substrate, an Si substrate or other semiconductor substrate, organic substrate, and the like can be exemplified.

Here, the second substrate 20 may be formed by a material having a smaller thermal expansion coefficient than that of the material for the first substrate 10 as well. In this case, if the temperature changes, a thermal stress is generated in the first substrate 10. At this time, a temperature dependency and a stress dependency of the acoustic wave constant are cancelled out by each other. Consequently, a change of the electrical characteristics of the acoustic wave element 1 due to a temperature change is reduced.

As such a material, for example, an Si substrate, sapphire substrate etc. can be exemplified. In the following example, a case where an Si substrate is used will be explained.

The thickness of the second substrate 20 is for example constant and may be suitably set. However, the thickness of the first substrate 10 in the present disclosure is relatively thin, therefore the second substrate 20 is determined considering a thickness able to support the first substrate 10. As one example, it may be set to 10 times or more of the thickness of the first substrate 10, and the thickness of the second substrate 15 is 50 to 300 μm. The planar shape and various dimensions of the second substrate 20 may be the same as those of the first substrate 10 as well.

Further, as in the present example, when using a material having a small thermal expansion coefficient as the second substrate 20, the thickness of the second substrate 20 is set considering the thickness of the first substrate 10 so that temperature compensation is carried out.

Further, the surface of the second substrate 20 on the side opposite to the first substrate 10 may also have bonded to it a not shown third substrate having a larger thermal expansion coefficient than that of the second substrate 20. In this case, the strength of the entire substrate can be improved, and warping due to thermal stress can be reduced to apply stronger thermal stress to the first substrate 10. For the third substrate, when the second substrate 20 is comprised of Si, use can be made of a ceramic board, Cu layer, resin board, or the like. Further, when the third substrate is provided, the thickness of the second substrate 2 may be made thinner as well.

Here, the SAW element 1 is provided with the low resistance region 50 at the intermediate position in the thickness of the composite substrate 60. The low resistance region 50 is given a sheet resistance of $5 \times 10^3 \Omega$ to $5 \times 10^7 \Omega$. By employing such a configuration, the electrical characteristics of the SAW element 1 can be improved. Below, the mechanism thereof will be explained.

When voltage is applied to the IDT electrode 3, the SAW element 1 emits a bulk wave in the thickness direction of the first substrate 10 in addition to the SAW propagating through the upper surface 10a of the first substrate 10. Further, this bulk wave is reflected at the lower surface 10b of the first substrate 10, returns to the upper surface 10a side, and is coupled with the electrode fingers 32, whereby an electrical signal due to an unwanted bulk wave (bulk wave spurious emission) is generated in the SAW element 1.

The present inventors intensively and repeatedly studied this. As a result, they found that bulk wave spurious emission was suppressed if the low resistance region 50 was provided in a lower part of the region in which the SAW propagates in the first substrate 10. Specifically, the thickness of the first substrate 10 and the sheet resistance of the low resistance region 50 were changed to simulate the ratio of the phase at the frequency in which the bulk wave spurious emission is generated, the ratio being compared with a case where there was no low resistance region. As a result, it was confirmed that the strength of the bulk wave spurious emission could be lowered by controlling the sheet resistance value of the low resistance region 50 to $5 \times 10^3 \Omega$ to $5 \times 10^7 \Omega$.

Figure 4:
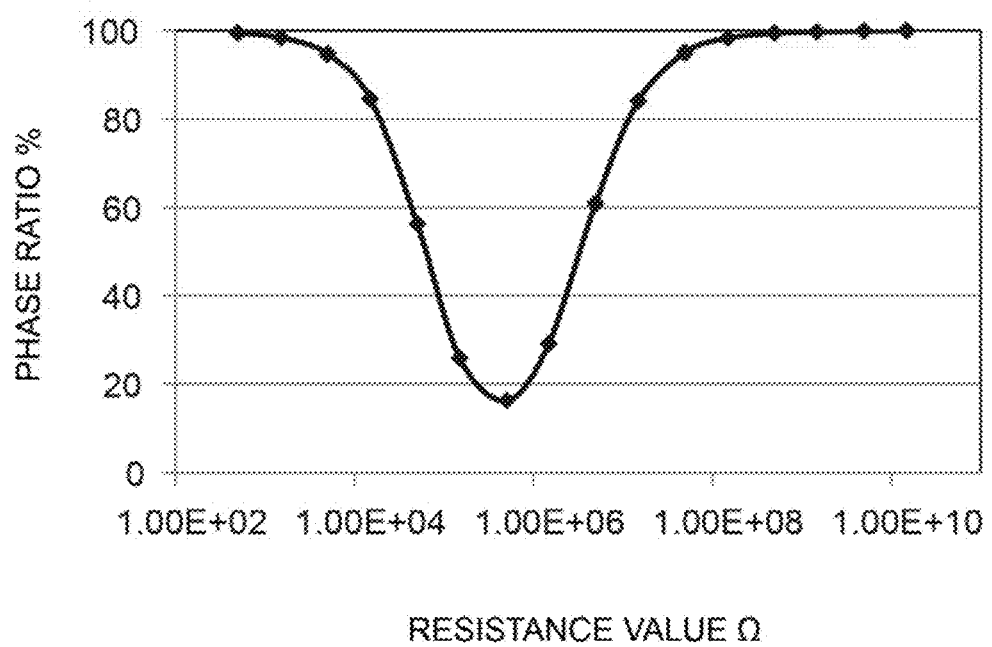
FIG. 4 is a graph showing the relationships between a sheet resistance value of a low resistance region and a phase ratio of a bulk wave spurious emission.

One example thereof will be shown in FIG. 4. FIG. 4 shows the ratio of the bulk wave spurious emission where the thickness of the first substrate 10 is 12 μm. In FIG. 4, an ordinate shows the ratio of the phase at the frequency in which the bulk wave spurious emission is generated, while an abscissa shows the sheet resistance of the low resistance region 50. Note that, the thickness of the low resistance region 50 is determined while adjusting the resistivity and the thickness so that a desired sheet resistance can be obtained.

As clear also from FIG. 4, it was confirmed that the strength of the bulk wave spurious emission could be greatly attenuated when making the sheet resistance value of the low resistance region 50 $5 \times 10^3 \Omega$ to $5 \times 10^7 \Omega$. In particular, it can be confirmed that the bulk wave spurious emission can be attenuated to about a half when controlling the resistance value to $5.0 \times 10^4 \Omega$ to $5 \times 10^6 \Omega$ and the bulk wave spurious emission can be greatly attenuated to 30% or less when controlling it to $1.5 \times 10^5 \Omega$ to $1.5 \times 10^6 \Omega$.

In this way, according to the acoustic wave element 1, by controlling the sheet resistance of the low resistance region 50 to the value explained above, the attenuation characteristic can be raised at the frequency in which the bulk wave spurious emission is generated. The reason for this is believed to be that by controlling the sheet resistance of the low resistance region 50 to the value explained above, a loss is generated in a bulk wave reaching the low resistance region 50 and consequently the bulk wave returning to the upper surface 10a side of the first substrate 10 is reduced.

Note that, if the sheet resistance exceeds $5 \times 10^7 \Omega$, the strength of the bulk wave spurious emission cannot be reduced. In the same way, when it is less than $5 \times 10^3 \Omega$ as well, the strength of the bulk wave spurious emission cannot be reduced. That is, even if an insulation material or a conductor made of metal etc. was interposed, reduction of the bulk wave spurious emission was not confirmed.

(Specific Configuration of Low Resistance Region 50)

The specific method of realization of the low resistance region 50 explained above will be explained. As explained above, the low resistance region 50 must be provided in the region which the bulk wave reaches. In addition, the sheet resistance of the low resistance region 50 must be changed compared with the region in the first substrate 10 through which the bulk wave passed before.

Therefore, as shown in FIG. 3A, the low resistance region 50 may be formed by making the sheet resistance in the region 10x which continues from the lower surface 10b of the first substrate 10 toward the upper surface 10a side different compared with the other regions in the first substrate 10 as well. In that case, in the region 10x, the sheet resistance may be adjusted by changing the composition from the stoichiometric ratio of the piezoelectric crystal configuring the first substrate 10 as well. Specifically, when the first substrate 10 is configured by the LT substrate, Li or Ta may be contained in a larger amount as well. That is, a region containing more of an element configuring the first substrate 10 or a region containing less of the element may be formed as well.

Further, in the first region 10x, an element changing the sheet resistance may be contained as well. Specifically, Fe, Ni, Cr, Cu, or another metal element or an element configuring the second substrate 20 (for example Si) may be contained as well.

In order to form the region 10x in the first substrate 10 in this way, for example, when bonding the first substrate 10 and the second substrate 20, a region containing more of a specific element may be formed by activating the surfaces of the two by irradiating them by an ion gun, FAB gun, or the like, and then supplying the specific element to the activated surfaces. Further, a region containing less of the specific element may be formed by adjusting the activation conditions and discharging only the specific element from the side of the bonding surface of the first substrate 10.

Figure 3B:
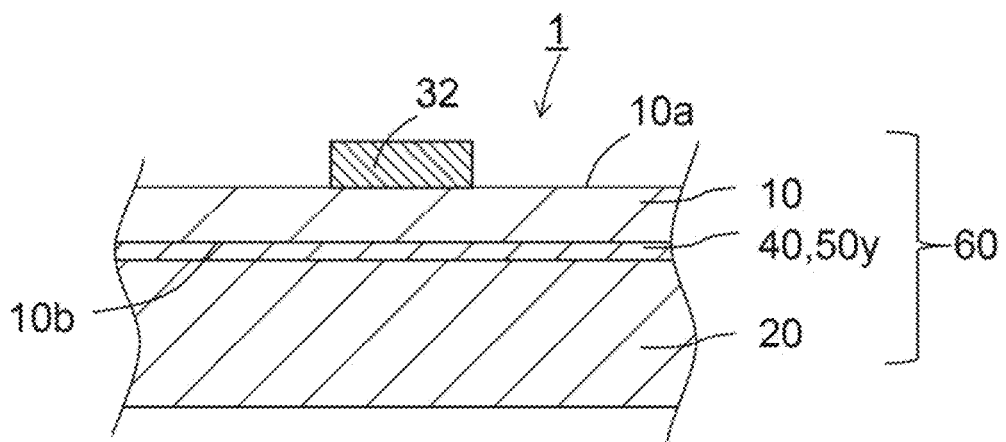
Figure 3C:
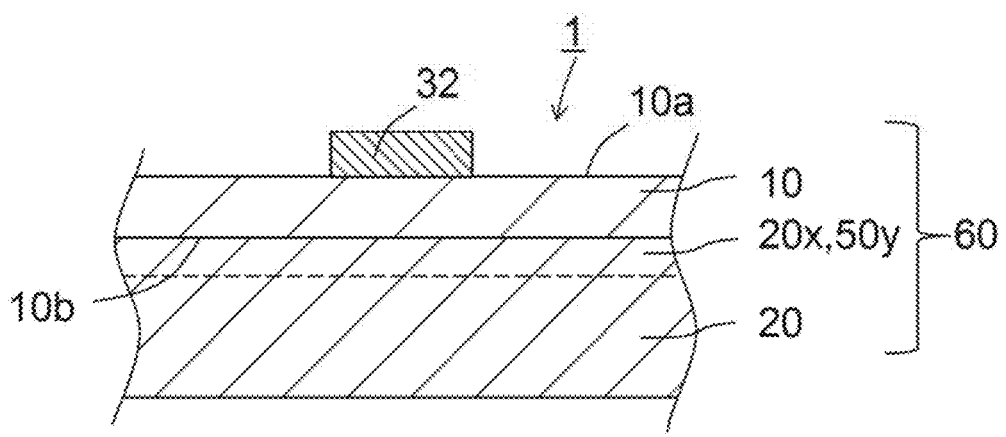

Next, as shown in FIG. 3B, a case where an intermediate layer 40 is interposed at the interface between the first substrate 10 and the second substrate 20, and this intermediate layer 40 is made the low resistance region 50 will be explained. In this case, the low resistance region 50 can be formed by forming the intermediate layer 40 configured by a material having a desired resistivity with a desired thickness. For example, an insulation material layer such as SiOx may be formed as the intermediate layer 40 on the surface of the second substrate 20, and a metal etc. may be diffused so as to adjust the resistivity thereof. Further, by activating the first substrate 10 and the second substrate 20 and press-bonding the two, a mixed layer or an amorphous layer having the ingredients of the two substrates may be formed as the intermediate layer 40 while adjusting the sheet resistance thereof.

Further, as shown in FIG. 3C, the low resistance region 50 may be formed by adjusting the sheet resistance of the region 20x in the second substrate 20 as well. Specifically, when the second substrate 20 is configured by an Si single crystal substrate, a dopant concentration may be adjusted on the bonding surface side of the second substrate 20 to form the low resistance region 50 as well. As the type of dopant, when the Si single crystal is an n-type, As or the like may be suitably selected, while when the Si single crystal is a p-type, B or the like may be suitably selected. Further, part of the elements configuring the first substrate 10 may be injected as well. In this case, the sheet resistance of the regions in the second substrate 20 other than the region 20x may be higher compared with the region 20x as well.

Such adjustment of the dopant concentration may be realized, for example, before bonding with the first substrate 10, by thermal diffusion from the surface of the second substrate 20, by ion implantation, or by formation of an epitaxial layer having a desired concentration. Further, in a state where the surface is activated at the time of bonding, a desired element may be supplied to the activated surface, thereby the region 20x may be formed.

Note that, when the low resistance region 50 is formed on the second substrate 20, the entire second substrate 20 may be made the low resistance region 50 as well.

Further, in addition to forming the low resistance region 50 in the region 10x of the first substrate 10 as shown in FIG. 3A, an interposed layer may be provided between the first substrate 10 and the second substrate 20 as well. The interposed layer may be one functioning as the bonding layer for bonding the two, may be an insulation layer having a lower sheet resistance than the low resistance region 50, or may be a heat radiation layer raising the heat radiation. For example, as the interposed layer, $SiO_2$ etc. can be exemplified.

Further, the first substrate 10 and second substrate 20 other than the low resistance region 50 may have a higher sheet resistance compared with the low resistance region 50 as well.

(Modification: Thickness of First Substrate 10)

In the example explained above, the thickness of the first substrate 10 was not particularly limited. However, it may be a thickness exceeding 1λ as well. In this case, the thickness becomes greater compared with the wavelength of the SAW, therefore the loss of the SAW which occurs due to the propagation of the SAW to the low resistance region 50 can be reduced. Due to this, the loss in the SAW element 1 can be reduced. In other words, due to the low resistance region 50, it is possible to attenuate only the bulk wave corresponding to the unwanted electrical signal without attenuating the SAW corresponding the electrical signal intended to be used.

FIG. 5 shows the results of simulation of the attenuation rate of the phase in the region between the resonance frequency and the antiresonance frequency at the time when the sheet resistance of the low resistance region 50 and the thickness of the first substrate 10 are changed. The attenuation rate of the phase was calculated in terms of the ratio relative to a case where the low resistance region 50 was not provided. That is, a case where the number is 100 in the table shows realization of a phase equal to that in the case where the low resistance region 50 is not provided. In this example, simulation is carried out for a case where 1λ is 5.4 µm.

As clear also from FIG. 5, it was confirmed that degradation of the phase in the region between the resonance frequency and the antiresonance frequency could be reduced in a case where the thickness of the first substrate 10 is a value exceeding 1λ (6 µm). Further, in a range of sheet resistance of the low resistance region 50 having the highest effect of suppressing the strength of the bulk wave spurious emission, it was confirmed that the degradation of the phase in the region between the resonance frequency and the antiresonance frequency could be greatly reduced by setting the thickness of the first substrate 10 to 1.3λ or more (7 µm).

Figure 6A:
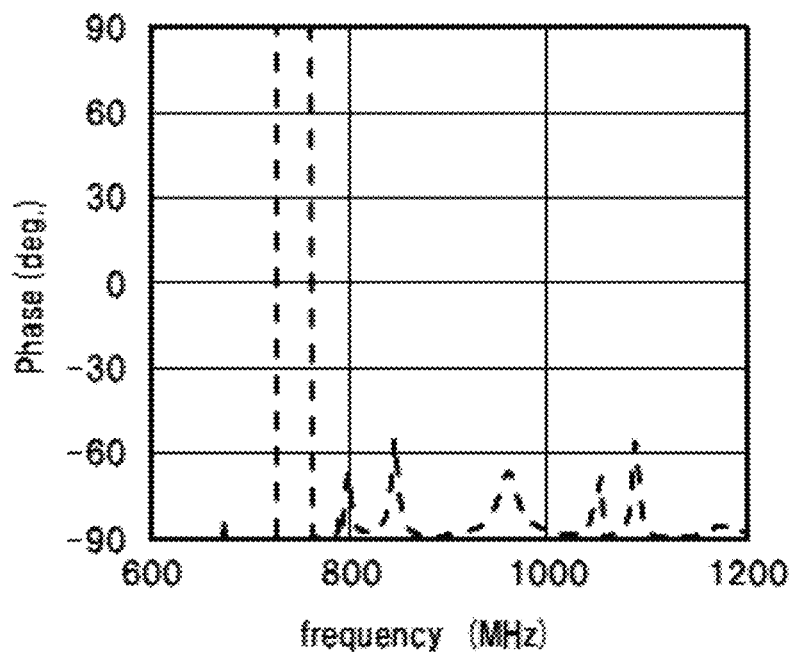
FIG. 6A and FIG. 6B are graphs showing frequency characteristics of a SAW element according to the present disclosure and a SAW element in a comparative example.
Figure 6B:
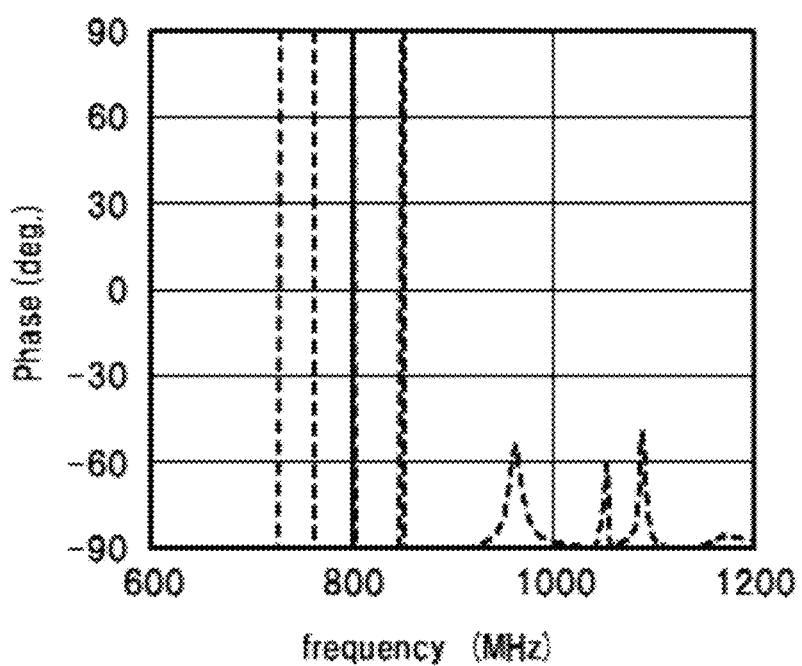

Here, FIG. 6A shows the results of simulation of the frequency characteristics of the SAW element 1 in a case where the thickness of the first substrate 10 was set to 10 µm, the thickness of the low resistance region 50 was set to 2 nm, and the resistivity of the low resistance region 50 was set to 0.1 Ωcm (that is, a sheet resistance of $5×10^5 Ω$). Further, FIG. 6B shows the results of simulation of the frequency characteristics of the SAW element having the same configuration as that of the SAW element 1 in FIG. 6A except for the point that the low resistance region 50 is not provided. In FIGS. 6, the abscissas show the frequencies (MHz), and the ordinates show the phases (deg). As clear also from FIGS. 6, it was confirmed that, according to the SAW element 1, the phases at the resonance frequency and antiresonance frequency near 780 MHz are not deteriorated from 90°, and only the bulk wave spurious emission positioned on a higher frequency side than the antiresonance frequency is reduced.

Figure 7:
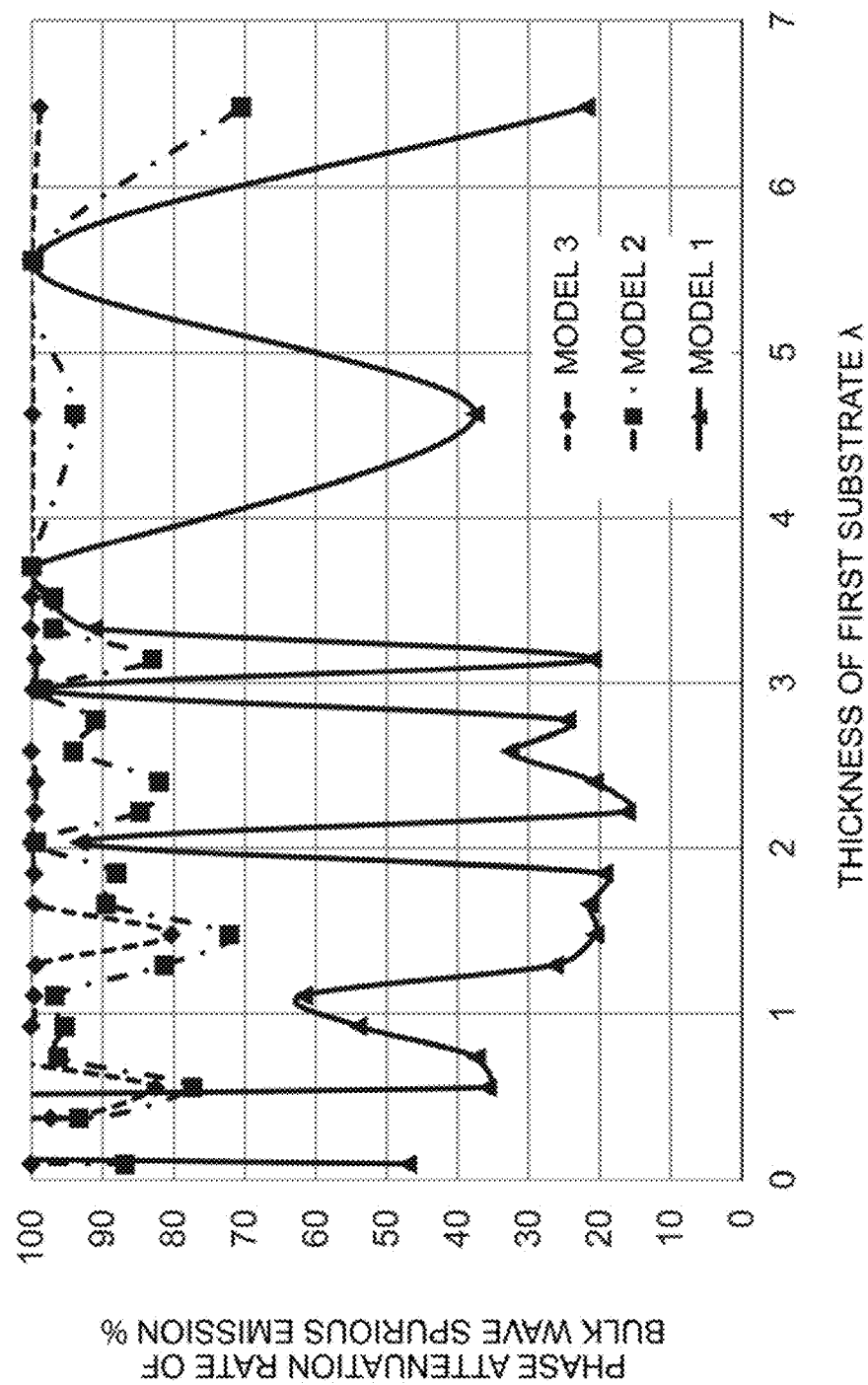
FIG. 7 is a graph showing the relationships between the thickness of a first substrate and the frequency characteristic of the acoustic wave element.

Next, simulation was carried out for the attenuation rate of the phase of the bulk wave according to the change of the thickness of the first substrate 10 for the case where the thickness of the first substrate 10 was set to 1λ or more. FIG. 7 shows a correlation between the thickness of the first substrate 10 and the attenuation rate of the phase. In FIG. 7, the abscissa shows the thickness (unit: λ) of the first substrate 10 in terms of the wavelength ratio, and the ordinate shows the phase attenuation rate of the bulk wave. In the simulation, the sheet resistance of the low resistance region 50 was set in the following way.

Model 1: $5 \times 10^5 \Omega$
Model 2: $1.5 \times 10^4 \Omega$
Model 3: $5 \times 10^2 \Omega$ As clear from FIG. 7, it is seen that there is a thickness of the first substrate 10 making the attenuation rate larger and a thickness of the first substrate 10 making the effect of attenuation smaller. Specifically, the attenuation rate becomes smaller when the thickness of the first substrate 10 is a whole multiple of λ. For this reason, the thickness of the first substrate 10 may be offset from a whole multiple of λ. Further, in a case of the sheet resistance value making the phase ratio (attenuation rate) larger (for example, $1.5 \times 10^5 \Omega$ to $1.5 \times 10^6 \Omega$) in FIG. 4, the absolute value of the attenuation rate can be made larger, and the range of the thickness of the first substrate 10 capable of making the attenuation rate larger can be made larger.

The upper limit value of the thickness of the first substrate 10 is not particularly limited. However, by controlling the thickness to an extent where the influence of the bulk wave spurious emission becomes conspicuous, the bulk wave spurious emission can be more effectively reduced by the low resistance region 50. Specifically, the thickness may be made not more than 20λ. Further, when the thickness of the first substrate 10 is set to 37 or less, as shown in FIG. 7, the attenuation rate can be maintained high.

Note that, in FIG. 7, when the sheet resistance of the low resistance region 50 is $5 \times 10^3 \Omega$ to $5 \times 10^7 \Omega$ as well, the attenuation rate seems to be low at the time when the thickness of the first substrate 10 is a specific thickness (whole multiple of λ). However, when viewing the entire bulk wave spurious emission as shown in FIGS. 6, the state of attenuation can be confirmed. Further, it is confirmed that in a case where the sheet resistance of the low resistance region 50 is controlled to $5.0 \times 10^4 \Omega$ to $5 \times 10^6 \Omega$, attenuation is caused from the viewpoint of the maximum phase as well even if the thickness of the first substrate 10 is a specific thickness (whole multiple of λ).

The study explained above was carried out based on the configuration in FIG. 3B. For this reason, the thickness range shown in the example explained above is the thickness of the first substrate 10 itself. However, in the case where the low resistance region 50 is the first region 10x as shown in FIG. 3A, the thickness range explained above corresponds to the difference between the thickness of the first substrate 10 and the thickness of the low resistance region 50.

(Modification: Thickness of Low Resistance Region 50)

In each of the configurations explained above, the thickness of the low resistance region 50 may be suitably designed so that the desired sheet resistance can be realized for the resistivity of the low resistance region 50.

Figure 8:
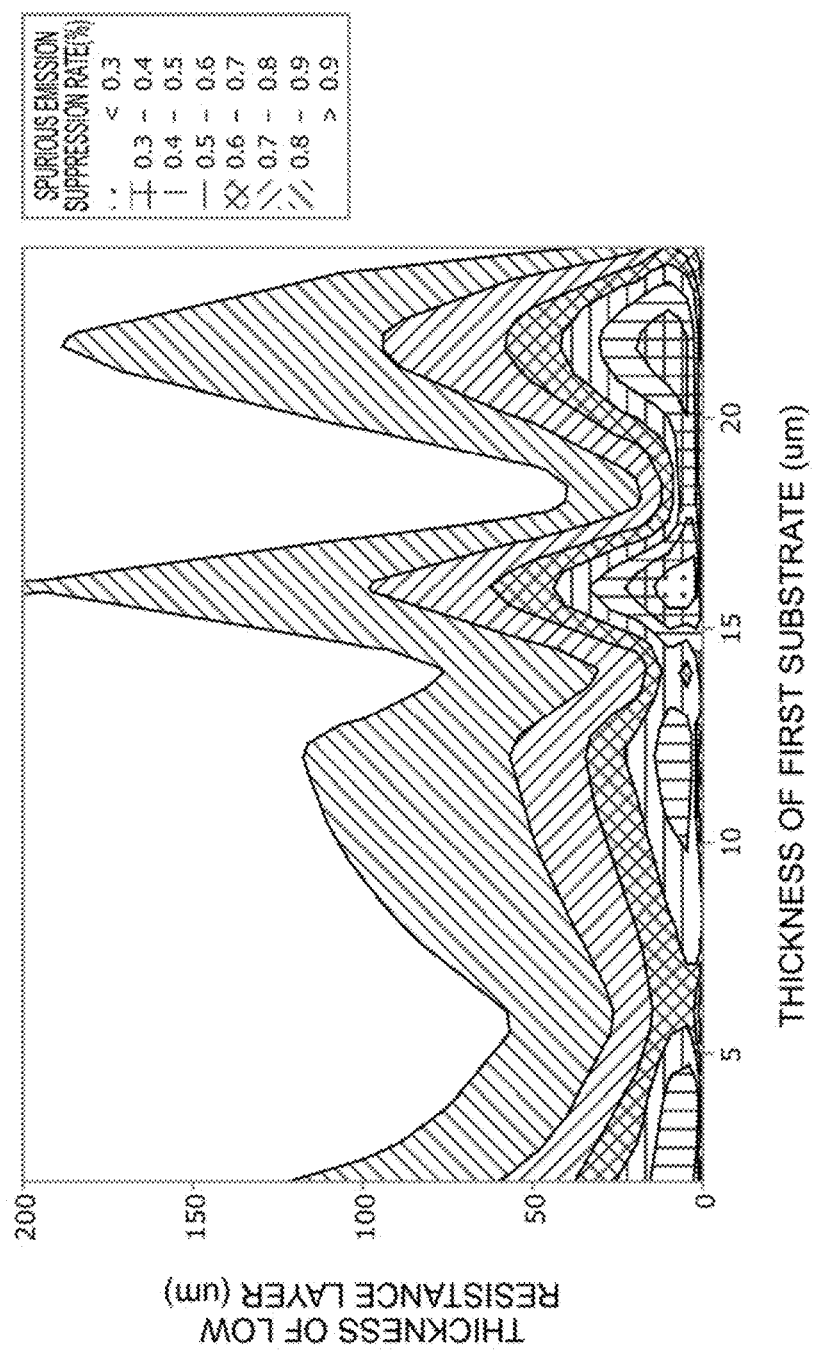
FIG. 8 is a view of a contour line showing the relationships between the thickness of the first substrate and the thickness of the low resistance region and an attenuation rate of the bulk wave spurious emission.

The results of the attenuation rate of the SAW element obtained when changing the thickness of the low resistance region 50 and the resistivity so that the sheet resistance of the low resistance region 50 becomes $9 \times 10^4 \Omega$ will be shown in FIG. 8. In FIG. 8, the abscissa shows the thickness of the first substrate 10, while the ordinate shows the thickness of the low resistance region 50. The conditions other than the low resistance region 50 are the same as the conditions in the other simulations.

As clear also from FIG. 8, it could be confirmed that there was an effect of attenuation of the bulk wave spurious emission even if the thickness of the low resistance region 50 was greater than the thickness of the first substrate 10. Specifically, there is the effect of attenuating the bulk wave spurious emission so long as the thickness of the low resistance region 50 is 100 μm or less.

However, as shown in FIG. 8, the smaller the thickness of the low resistance region 50, the higher the attenuation rate tends to be. Therefore, the thickness may be made thinner than the first substrate 10. More specifically, it can be confirmed that the effect of the low resistance region 50 can be exerted by setting the thickness to for example 2 nm or more. Further, when the thickness exceeds 200 nm, there is a possibility of the relationship between the sheet resistance value and the thickness collapsing, therefore the thickness may be set to 200 nm or less as well.

EXAMPLES

In order to confirm the effects of the acoustic wave element 1 in the present disclosure, the following model was prepared and simulation carried out to confirm the frequency characteristics.

The basic conditions of simulation were as follows:

First substrate 10: LT substrate, 42° Y-cut, and X-propagated
Thickness of first substrate 10: 2.2 μm (that is, 0.4λ)
Pitch of electrode fingers 32 in IDT electrode 3: 2.7 μm (λ=5.4 μm)
Material of IDT electrode 3: Al
Thickness of electrode finger 32 in IDT electrode 3: 0.08λ,
Second substrate 20: Si single crystal substrate As Example 1, as shown in FIG. 3B, a layer having a thickness of 2 nm and resistivity of 0.05 Ωcm was provided between the first substrate 10 and the second substrate 20 as the low resistance region 50. That is, the sheet resistance became $2.5 \times 10^5 \Omega$.

As a comparative example, a model with no low resistance region 50 between the first substrate 10 and the second substrate 20 was prepared.

Figure 9A:
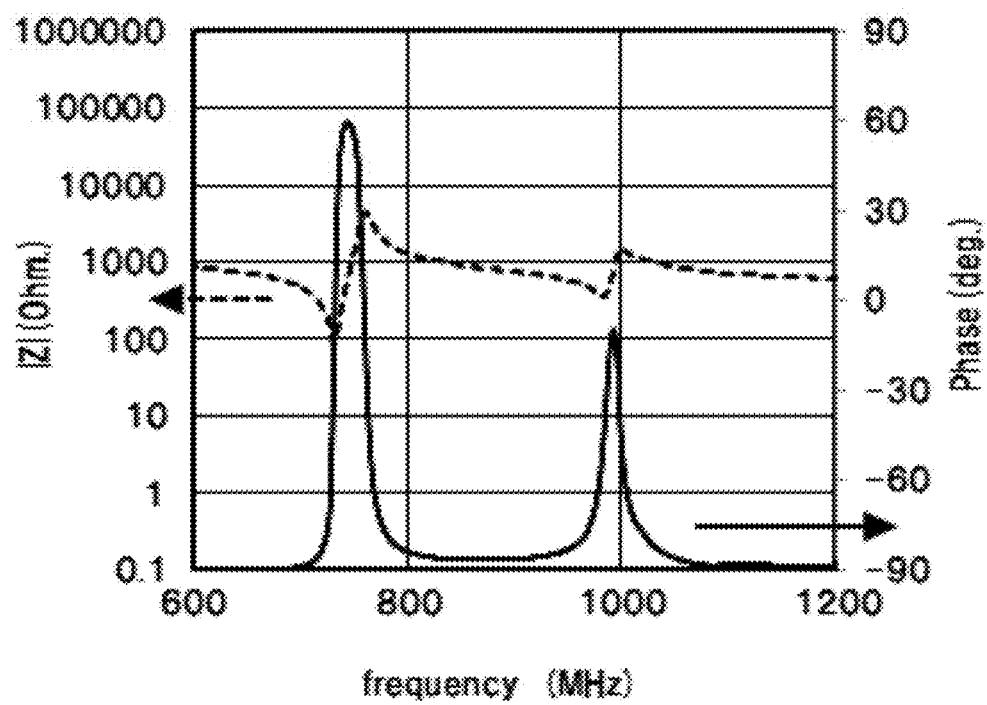
FIG. 9A and FIG. 9B are graphs showing frequency characteristics in an example and comparative example.
Figure 9B:
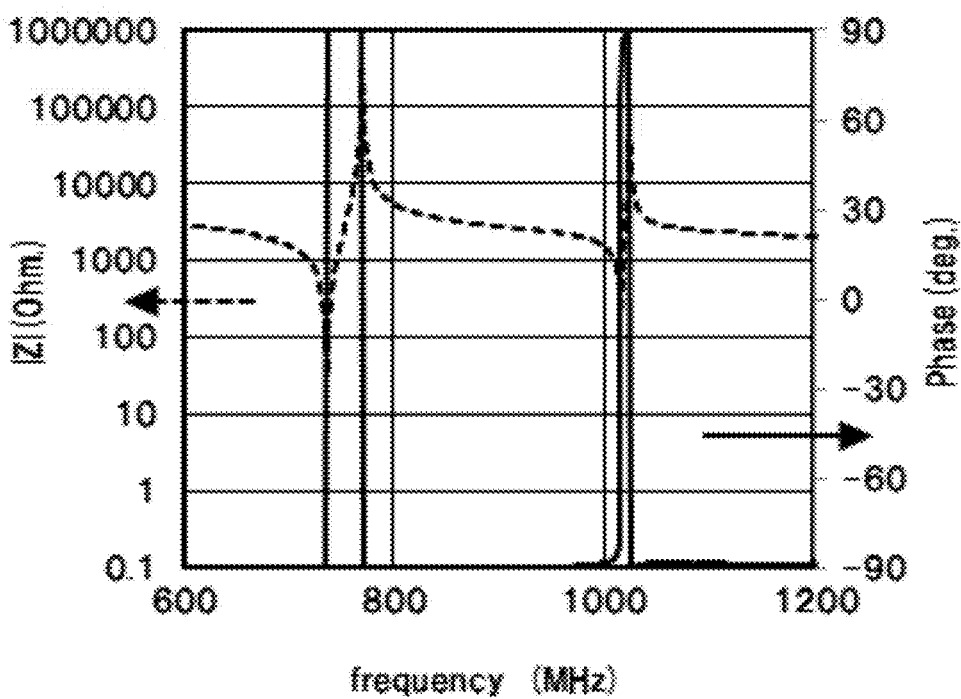

The results of simulation of the phase characteristic and impedance characteristic relative to the frequency for the model explained above will be shown in FIG. 9. FIG. 9A shows the results of Example 1, and FIG. 9B shows the results of a comparative example. In FIG. 9, the abscissas show the frequencies, and the ordinates show the impedances (Ω) on the right axes and show the phases (deg) on the left axes. Further, in FIG. 9, the impedance characteristics are indicated by broken lines, and the phase characteristics are indicated by solid lines.

As clear also from FIG. 9, it was confirmed that the strength of the bulk wave spurious emission which had been generated near 1000 MHz was attenuated in the model of Example 1 compared with the comparative example.

Next, as Example 2, simulation was carried out for a case where the thickness of the first substrate 10 was set to 15 μm (2.8λ). In Example 2, the conditions were made the same as those in Example 1 except for the thickness of the first substrate 10. Further, as Comparative Example 2, a model provided with the same configuration as that in Example 2 except that the low resistance region 50 was not provided was prepared and simulation carried out.

Figure 10A:
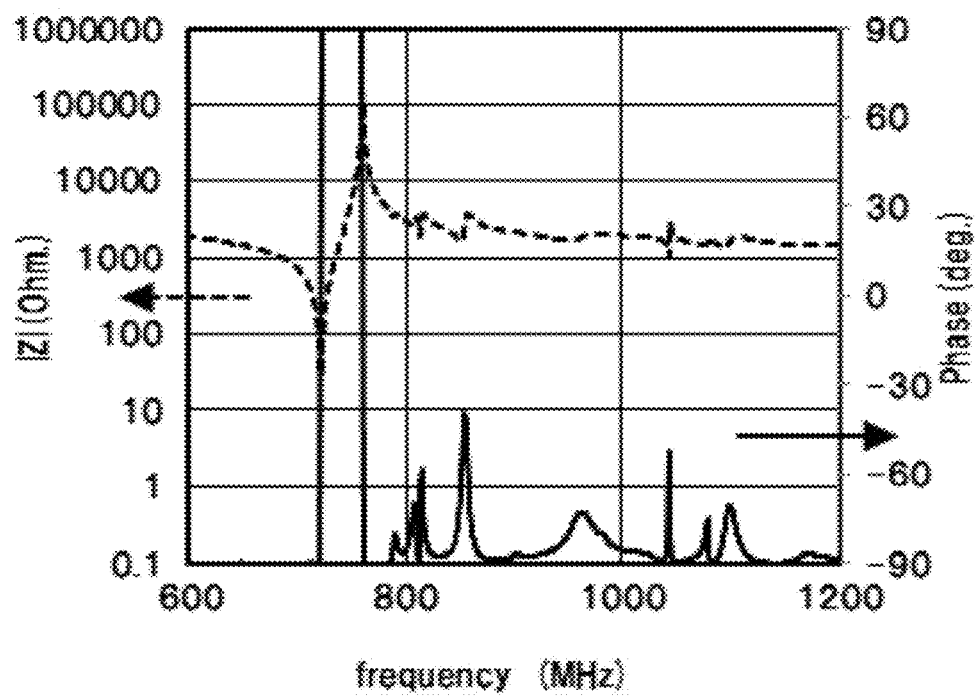
FIG. 10A and FIG. 10B are graphs showing the frequency characteristics in an example and comparative example.
Figure 10B:
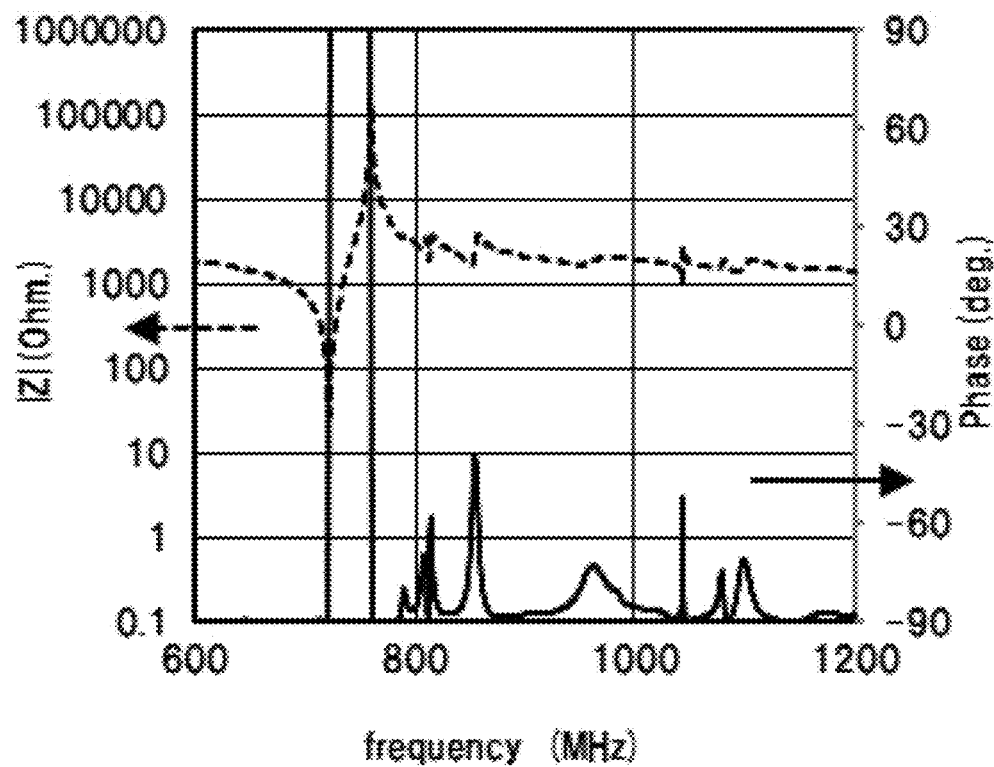

The results thereof will be shown in FIG. 10A and FIG. 10B. FIG. 10A shows the results of Example 2, while FIG. 10B shows the results of Comparative Example 2. As clear from a comparison between FIG. 10A and FIG. 10B, according to Example 2, the state of attenuation of the strength of the bulk wave spurious emission could be confirmed.

Further, as clear from a comparison between FIG. 10A and FIG. 9A, it was confirmed that by setting the thickness of the first substrate 10 to 1λ or more, the strength of the bulk wave spurious emission can be attenuated while the loss between the resonance frequency and the antiresonance frequency and on the side of higher frequency than the antiresonance frequency can be reduced.

REFERENCE SIGNS LIST

1: acoustic wave element
10: first substrate
20: second substrate
40: intermediate layer
3: IDT electrode
32: electrode finger
50: low resistance region
50x: first region
50y: second region

The invention claimed is:

1. An acoustic wave element comprising:
    an IDT electrode comprising a plurality of electrode fingers and exciting a surface acoustic wave,
    a first substrate comprising an upper surface on which the IDT electrode is located, the first substrate being configured by a piezoelectric crystal, and
    a second substrate bonded to a side where a lower surface of the first substrate is located, wherein a thickness of the first substrate is 0.4λ, or more and 20λ, or less where λ is a wavelength defined by 2 times a repeating interval of the plurality of electrode fingers, and
    a thin interface region between the first substrate and the second substrate which is either a first region of the first substrate or a second region of the second substrate has a low sheet resistance region of $5 \times 10^3 \Omega/\square$ to $5 \times 10^7 \Omega)/\square$.

2. The acoustic wave element according to claim 1, wherein a thickness obtained by subtracting a thickness of the first region from a thickness of the first substrate in a case where the first region is the low resistance region, or the thickness of the first substrate in a case where the second region is the low resistance region, is 1.3λ or more.

3. The acoustic wave element according to claim 1, wherein the first substrate is an X-propagated and rotated Y-cut lithium tantalate single crystal substrate.

4. The acoustic wave element according to claim 1, wherein
    the low resistance region is configured by the second region which is configured by an intermediate layer interposed between the first substrate and the second substrate, and
    the intermediate layer contains an element configuring the first substrate or the second substrate and a metal.

5. The acoustic wave element according to claim 1, wherein the low sheet resistance region is the first region, and,
    in the first region, a concentration of an element configuring the first substrate is different compared to that in other regions of the first substrate.

6. The acoustic wave element according to claim 1, wherein the low sheet resistance region is the second region, and
    the second region contains a larger concentration of an element configuring the second substrate compared to that in other regions of the second substrate.

7. The acoustic wave element according to claim 1, wherein
    the low resistance region is configured by the second region configured in a region in the second substrate, this region continuing from a surface on the first substrate side,
    the second substrate comprising a semiconductor material, and the second region has a higher dopant concentration than a part other than the second region in the second substrate.

8. The acoustic wave element according to claim 1, wherein a thickness of the low resistance region is 2 nm to 200 nm.

* * * * *